(12) United States Patent
Katoda

(10) Patent No.: US 7,671,378 B2
(45) Date of Patent: *Mar. 2, 2010

(54) PHOTONIC DEVICES FORMED ON SUBSTRATES AND THEIR FABRICATION METHODS

(75) Inventor: Takashi Katoda, 4804-83, Ikku, Kochi-shi (JP)

(73) Assignee: Takashi Katoda, Kochi-shi (JP)

( * ) Notice: Subject to any disclaimer, the term of this patent is extended or adjusted under 35 U.S.C. 154(b) by 26 days.

This patent is subject to a terminal disclaimer.

(21) Appl. No.: 11/330,154

(22) Filed: Jan. 12, 2006

(65) Prior Publication Data

US 2006/0157696 A1 Jul. 20, 2006

(30) Foreign Application Priority Data

Jan. 18, 2005 (JP) .............................. 2005-010248

(51) Int. Cl.
*H01L 29/74* (2006.01)

(52) U.S. Cl. .................. 257/103; 257/12; 257/183; 257/E29.094; 257/E29.096; 257/E29.143

(58) Field of Classification Search .................. 257/12, 257/103, 183, E29.094, E29.096, E29.143
See application file for complete search history.

(56) References Cited

U.S. PATENT DOCUMENTS

| 3,503,798 | A | 3/1970 | Yoshioka et al. |
| 3,728,594 | A | 4/1973 | Yim et al. |
| 4,373,145 | A | 2/1983 | McCarthy et al. |
| 4,965,594 | A | 10/1990 | Komuro |
| 5,038,609 | A | 8/1991 | Kumada |
| 5,293,510 | A * | 3/1994 | Takenaka ..................... 257/295 |
| 5,571,612 | A | 11/1996 | Motohiro et al. |
| 5,838,029 | A | 11/1998 | Shakuda |
| 5,990,500 | A | 11/1999 | Okazaki |
| 6,252,158 | B1 | 6/2001 | Higashikawa |
| 6,498,358 | B1 * | 12/2002 | Lach et al. ................... 257/183 |
| 6,513,362 | B1 | 2/2003 | Yadav et al. |
| 6,627,959 | B1 | 9/2003 | Tuller et al. |
| 7,250,630 | B2 | 7/2007 | Katoda |
| 2004/0240501 | A1 * | 12/2004 | Katoda ........................ 372/43 |

(Continued)

FOREIGN PATENT DOCUMENTS

EP 1 482 564 12/2004

(Continued)

OTHER PUBLICATIONS

Pending claims of U.S. Appl. No. 10/848,145 as of Jan. 29, 2007.

(Continued)

*Primary Examiner*—Fernando L Toledo
(74) *Attorney, Agent, or Firm*—Eric J. Robinson; Robinson Intellectual Property Law Office, P.C.

(57) ABSTRACT

The present invention directed to photonic devices which emit or absorb light with a short wavelength formed using molybdenum oxide grown on substrates which consist of materials selected from element semiconductors, III-V or II-IV compound semiconductors, IV compound semiconductors, organic semiconductors, metal crystal and their derivatives or glasses.

New inexpensive photonic devices which emit light with a wavelength from blue to deep ultraviolet rays are realized.

14 Claims, 1 Drawing Sheet

U.S. PATENT DOCUMENTS

| | | | |
|---|---|---|---|
| 2004/0251457 A1* | 12/2004 | Katoda | 257/12 |
| 2005/0062409 A1* | 3/2005 | Yamazaki et al. | 313/504 |
| 2005/1015619 | 7/2005 | Tsutsui et al. | |
| 2005/0263756 A1* | 12/2005 | Yatsunami et al. | 257/40 |
| 2006/0038242 A1* | 2/2006 | Hsu et al. | 257/407 |
| 2006/0091797 A1* | 5/2006 | Tsutsui et al. | 313/506 |
| 2006/0157695 A1 | 7/2006 | Katoda | |

FOREIGN PATENT DOCUMENTS

| | | |
|---|---|---|
| JP | 52-046098 | 11/1977 |
| JP | 2002-217425 | 8/2002 |
| JP | 2004-356481 | 12/2004 |

OTHER PUBLICATIONS

Pending claims of U.S. Appl. No. 10/863,288 as of Feb. 16, 2007.
Pending claims of U.S. Appl. No. 11/330,153 as of Jan. 2, 2008.
Specification, Drawings, Claims and Abstract filed Jan. 12, 2006 for U.S. Appl. No. 11/330,153.
Transmittal of Priority Document filed Jan. 26, 2006 for U.S. Appl. No. 11/330,153.
Non-Final Official Action mailed Oct. 2, 2007 for U.S. Appl. No. 11/330,153.
Amendment filed Jan. 2, 2008 for U.S. Appl. No. 11/330,153.
Information Disclosure Statement filed Jan. 2, 2008 for U.S. Appl. No. 11/330,153.
Final Official Action mailed Mar. 20, 2008 for U.S. Appl. No. 11/330,153.
Response filed Jun. 20, 2008 for U.S. Appl. No. 11/330,153.
Advisory Action mailed Jul. 31, 2008 for U.S. Appl. No. 11/330,153.
Response filed Aug. 20, 2008 for U.S. Appl. No. 11/330,153.
Supplemental Response filed Aug. 21, 2008 for U.S. Appl. No. 11/330,153.
Non-Final Official Action mailed Sep. 12, 2008 for U.S. Appl. No. 11/330,153.
Amendment filed Dec. 12, 2008 for U.S. Appl. No. 11/330,153.
Information Disclosure Statement filed Jan. 27, 2009 for U.S. Appl. No. 11/330,153.
Specification, Drawings, Claims and Abstract filed May 19, 2004 for U.S. Appl. No. 10/848,145.
Preliminary Amendment Document filed May 19, 2004 for U.S. Appl. No. 10/848,145.
Information Disclosure Statement filed Aug. 10, 2004 for U.S. Appl. No. 10/848,145.
Non-Final Official Action mailed Mar. 24, 2006 for U.S. Appl. No. 10/848,145.
Amendment filed Jun. 26, 2006 for U.S. Appl. No. 10/848,145.
Final Official Action mailed Sep. 29, 2006 for U.S. Appl. No. 10/848,145.
Amendment filed Jan. 29, 2007 for U.S. Appl. No. 10/848,145.
Interview Summary filed Mar. 28, 2007 for U.S. Appl. No. 10/848,145.
Interview Summary mailed Apr. 2, 2007 for U.S. Appl. No. 10/848,145.
Restriction/Election Requirement mailed Apr. 12, 2007 for U.S. Appl. No. 10/848,145.
Response to Election Requirement filed May 9, 2007 for U.S. Appl. No. 10/848,145.
Non-Final Official Action mailed Aug. 9, 2007 for U.S. Appl. No. 10/848,145.
Response filed Nov. 9, 2007 for U.S. Appl. No. 10/848,145.
Terminal Disclaimer filed Nov. 9, 2007 for U.S. Appl. No. 10/848,145.
Non-Final Official Action mailed Mar. 5, 2008 for U.S. Appl. No. 10/848,145.
Amendment filed Jun. 5, 2008 for U.S. Appl. No. 10/848,145.
Final Official Action mailed Jul. 24, 2008 for U.S. Appl. No. 10/848,145.
Amendment filed Oct. 24, 2008 for U.S. Appl. No. 10/848,145.
Notice of Non-Compliant Amendment mailed Nov. 20, 2008 for U.S. Appl. No. 10/848,145.
Response to Notice of Non-Compliant Amendment filed Dec. 20, 2008 for U.S. Appl. No. 10/848,145.
Information Disclosure Statement filed Jan. 26, 2009 for U.S. Appl. No. 10/848,145.
Response filed Jan. 26, 2009 for U.S. Appl. No. 10/848,145.
Advisory Action mailed Jan. 30, 2009 for U.S. Appl. No. 10/848,145.
Specification, Drawings, Claims and Abstract filed Jun. 9, 2004 for U.S. Appl. No. 10/863,288.
Non-Final Official Action mailed May 2, 2006 for U.S. Appl. No. 10/863,288.
Amendment filed Aug. 2, 2006 for U.S. Appl. No. 10/863,288.
Final Official Action mailed Oct. 16, 2006 for U.S. Appl. No. 10/863,288.
Amendment filed Feb. 16, 2007 for U.S. Appl. No. 10/863,288.
Notice of Allowability mailed Mar. 20, 2007 for U.S. Appl. No. 10/863,288.
Issue Notification mailed Mar. 20, 2007 for U.S. Appl. No. 10/863,288.
Pettus C., "A Molybdenum-Oxide Negative-Resistance Device", Jan. 1965, Proc. IEEE, vol. 53, No. 1, p. 98.
Office Action (Application No. 2003-154107) Dated Oct. 27, 2008.
Ivanova, T., et al., "Investigation of CVD Molybdenum Oxide Films," Materials Letters, vol. 53, Apr. 2002, pp. 250-257.
European Search Report (Application Serial No. 04011665.9) dated Jul. 8, 2004.
European Search Report (Application No. 06000615.2) dated Aug. 18, 2008.
Chen et al., "Structural, Electrical, and Optical Properties of Transparent Conductive Oxide ZnO:Al Films Prepared by DC Magnetron Reactive Sputtering," Journal of Vacuum Science and Technology, Part A, vol. 19, No. 3, May 2001, pp. 963-970.
Ferreira et al., "Lithium Insertion and Electrochromism in Polycrystalline Molybdenum Oxide Films," Solid State Ionics, vol. 136-137, Nov. 2, 2000, pp. 357-363.
Guha et al., "Ultraviolet and Violet GaN Light Emitting Diodes on Silicon," Applied Physics Letters, vol. 72, No. 4, Jan. 26, 1998, pp. 415-417.
Dalmasso et al., "Green Electroluminescent (Ga, In, Al)N LEDs Grown on Si(111)," Electronic Letters, vol. 36, No. 20, Sep. 28, 2000, pp. 1728-1730.
JP Office Action (Application No. 2005-010248) dated Oct. 14, 2008.

* cited by examiner

PHOTONIC DEVICES FORMED ON SUBSTRATES AND THEIR FABRICATION METHODS

BACKGROUND OF THE INVENTION

Field of the Invention

The present invention relates to semiconductor photonic devices including molybdenum oxide formed on substrates which consist of materials which are used in known semiconductor photonic devices. The semiconductor photonic devices according to the present invention emit or absorb light with a short wavelength.

More particularly, the present invention relates to new light emitting diodes which emit blue or ultraviolet light formed on substrates consisting of materials which are used in known semiconductor photonic devices. The photonic devices according to the present invention have possibility to overcome problems accompanying to devices made up of known semiconductors such as gallium nitride (GaN) or silicon carbide (SiC). Moreover, the present invention relates to photonic devices formed on substrates consisting of materials which are used in known semiconductor photonic devices which emit light with a wavelength shorter than 361 nm in which GaN light-emitting diodes can emit. In addition, the present invention relates to light absorbing devices formed on substrates consisting of materials which are used in known semiconductor light absorbing devices which absorb light having a wavelength shorter than 361 nm and convert to electric power.

The present invention relates to also a new method to fabricate said photonic devices on substrates made of material which has been used in usual electronic and photonic devices.

RELATED BACKGROUND ART

Light emitting diodes which emit blue light have developed recently in order to realize three primary colors of light and to obtain light with a shorter wavelength for digital video disc (DVD). Developed blue-light emitting devices use gallium nitride (GaN) as an active region which is very important to emit light. The bandgap of GaN is about 3.43 eV which corresponds to a wavelength of 361 nm. Although blue light can be obtained from GaN devices, there are some difficult problems. At first, bulk crystal of GaN has not been obtained because an equilibrium vapor pressure of nitrogen is very high relative to that of gallium. Therefore, substrates made up of sapphire or silicon carbide (SiC) are used. GaN cannot be formed directly on a sapphire substrate because there is lattice mismatch of 16% between sapphire and GaN. Therefore a buffer layer of aluminum nitride (AlN) is formed on a sapphire substrate before growth of GaN. AlN is resistive because it is difficult to dope impurities into AlN. A structure and its fabrication process, therefore, are severely restricted. On the other hand, SiC substrates are very expensive because bulk crystal of SiC can be grown at a very high temperature of 2200-24000° C.

Zinc oxide (ZnO) has possibility to be used to form a blue-light emitting device. However, its bandgap is 3.2 eV which corresponds to a light wavelength of 387 nm which is larger than that GaN devices emit. Moreover, ZnO has many problems to be solved to realize practical devices.

The shortest wavelength of light which semiconductor photonic devices can emit at present is that GaN devices can emit. The maximum density of DVD memory is decided by the wavelength. Therefore, a new photonic device which can emit light with a shorter wavelength is expected in order to increase the maximum density of DVD memory or to replace gas lasers such as He—Cd laser. In addition, a new blue-light emitting device made up of new material is expected because present blue-light emitting devices have many problems as described above. Moreover, a new device which can emit light with a wavelength shorter than 361 nm which GaN devices can emit or a shorter wavelength of deep ultraviolet rays such as 250-350 nm is expected.

The problem to be solved to realize a new device is to obtain a new substrate which replaces expensive substrate such as sapphire or SiC.

The second problem is to realize new semiconductor which can be grown at a lower temperature at which GaN or SiC layers are formed. Large energy is necessary to form semiconductor layers at a high temperature. In addition, there are possibilities that atoms move between layers and a composition is disturbed or dopants move near the interface between layers. It is necessary to form layers of GaN or SiC at a temperature higher than 1000° C.

The problems described above can be partly solved by using molybdenum oxide for such photonic devices. The inventor of the present invention discovered that high quality molybdenum oxide crystal has a bandgap larger than 3.2 eV and is very useful to be used in photonic and electronic devices (U.S. patent application Ser. No. 10/848,145 and Ser. No. 10/863,288).

In the patent applications described above, the facts and methods discovered by the inventor of the present invention are described. They are summarized as follows.

(i) High quality molybdenum oxide crystal has a bandgap of 3.45~3.85 eV. The results were obtained by experiment for molybdenum oxide layer with a thickness larger than 10 μm grown by oxidation of a molybdenum plate with a purity of 99.99% in oxygen with a purity of 99.9995%. For example, molybdenum oxide formed by oxidation at 550° C. for 120 min, had a bandgap of 3.66 eV. The reason why molybdenum oxide formed by the method invented by the inventor of the present invention had a bandgap larger than that previously reported is that it was high quality molybdenum oxide crystal having a thickness larger than that previously reported. A bandgap is affected by structure of a layer, that is, crystal or non-crystal, strain in the layer and purity.

(ii) It was confirmed that molybdenum oxide formed by the present inventor's method is semiconductor also based on measurement of electronic properties.

However, in the patent applications described above, the molybdenum oxide crystal was formed by oxidation of a part of a metallic molybdenum plate. Because the molybdenum plate was not crystal, some fabrication technologies such as cleavage could not used. Furthermore, precise control of a thickness of the molybdenum oxide layer was difficult when it was formed by oxidation of a molybdenum plate.

Therefore it is required to form a layer of semiconductor crystal having a bandgap larger than 3.2 eV on a new substrate which preferably consists of material which is used in known devices and preferably is crystal.

Because molybdenum oxide can be made at a temperature lower than 850° C., the second problem described above can be solved by using high quality molybdenum oxide in a principal part of the devices.

SUMMARY OF THE INVENTION

The present invention is directed to semiconductor photonic devices comprising of metal oxide grown on substrates and their fabrication method.

The metal oxide comprises molybdenum oxide which has a bandgap larger than 3.2 eV and is very useful to fabricate photonic devices. Molybdenum oxide is especially useful to fabricate a light emitting diode or a laser diode which emits light with a wavelength shorter than 387 nm.

An important aspect of the present invention is that a molybdenum oxide film is formed on a substrate consisting of any material which has been traditionally used in usual photonic and electronic devices. The most popular material, that may be used as such a substrate material, is silicon.

Another important aspect of the present invention resides in a novel method to fabricate photonic devices on substrates. According to this novel method, at least a first layer of metal oxide is formed on a substrate, preferably molybdenum oxide formed directly on the substrate. The present invention's novel method includes following series steps. A substrate and source material are disposed in a growth chamber at a first step. Typical source material is a molybdenum plate and a typical substrate comprises silicon. A temperature profile is formed in the growth chamber such that a temperature at the source material is higher than that at the substrate at a second step. After the temperature profile is formed, oxygen gas is flowed for a predetermined period-which depends on a thickness of the molybdenum oxide which is required to form a specific device at a third step.

A molybdenum oxide layer (or layers) in photonic devices can be formed by using any method which includes steps similar to the steps described above. In those cases, the substrate may include a part of devices.

Any suitable substrate consists of material that is selected from IV element semiconductors such as silicon and germanium, III-V compound semiconductors such as gallium arsenide and gallium phosphide, II-IV compound semiconductors such as zinc oxide, IV compound semiconductors, organic semiconductors, metal crystals or their derivatives or glasses.

DETAILED DESCRIPTION OF THE PREFERRED EMBODIMENTS

Reference will now be made in greater detail to preferred embodiments of the invention.

Figure 1:
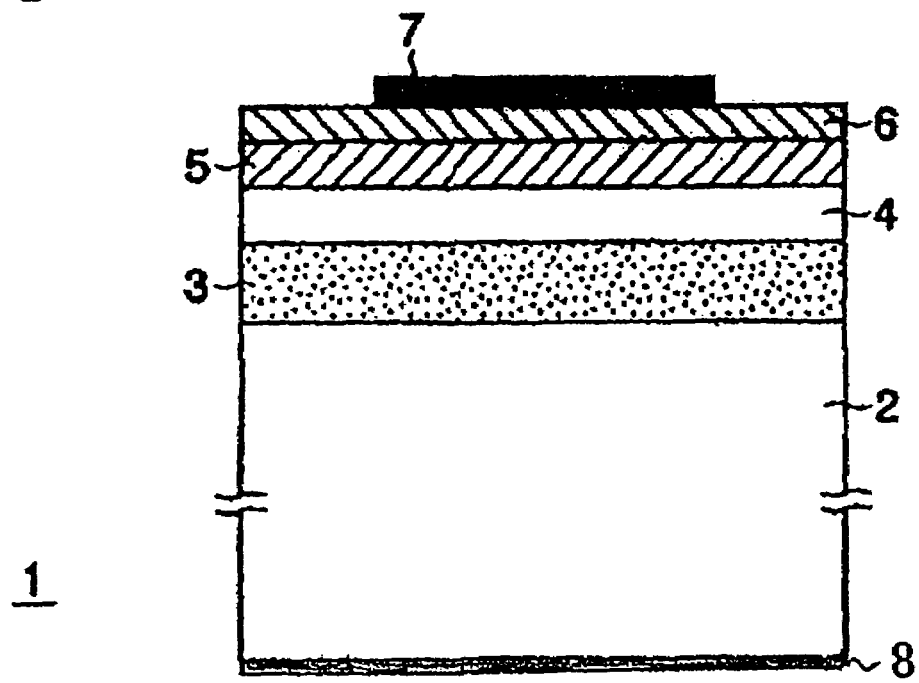
FIG. 1 is a schematic view of a light emitting diode according to the first embodiment of the present invention.

FIG. 1 shows schematically a structure of a light emitting diode (1) according to the first embodiment of the present invention. In this embodiment, a substrate (2) consists of silicon. However other materials can be used as a substrate. It is desirable that the substrate is electrically conductive. A layer (3) consists of molybdenum oxide formed on the silicon substrate (2). The layer (3) was formed by the following steps. A molybdenum (Mo) plate was used as source and silicon (Si) substrate was used in this example. At first, the source and the silicon substrate (2) were rinsed and dried. Then they were set in a growth chamber. At the next step, the growth chamber was heated so that a temperature at the source zone was 650° C. and that at the substrate zone was 550° C. under nitrogen atmosphere. After the source and the substrate (2) were heated to the temperatures, respectively, high-purity oxygen was flowed in the growth chamber and kept for 6 hours. A thickness of the layer (3) was 6 μm. Although the layer (3) was not intentionally doped, it was n type. It is considered that oxygen vacancies act as donors. A buffer layer (4) was formed on the layer (3) in order to confine disorder in the layer (3) which originates because the layer (3) has a different composition from the substrate (2). For example, the layer (4) consists of molybdenum oxide formed by the similar method used to form the layer (3) with a growth condition in which a source temperature was 700° C. and that of a substrate was 630° C. It was n type with a carrier concentration of $3 \times 10^{17}$ cm$^{-3}$.

A thickness of the layer (4) was 4.0 μm. A layer (5) of molybdenum oxide was formed on the layer (4). The layer (5) was formed, for example, by the method similar to the method used to form the layer (3) in which a temperature of the source was 670° C. and that of the substrate was 600° C. It was n type with an electron concentration of $6 \times 10^{16}$ cm$^{-3}$. Crystallographic quality of the layer (5) was better than that of the layer (4). A thickness of the layer (5) was 3.0 μm. It is not necessary to form the layer (5) when it is not necessary to make efficiency of the light emitting diode (1) as high as possible. A layer (6) of p-type molybdenum oxide was formed on the layer (5). The layer (6) was doped, for example, with zinc to a hole concentration of $1.0 \times 10^{17}$ cm$^{-3}$. The layer (6) was formed by the method similar to that used to form the layer (3) in which a temperature of the source was 650° C., that of the substrate was 550° C. and dopant source ZnO was set in a region between the source and the substrate. A temperature of the dopant source was 630° C. A thickness of the layer (6) was 2.0 μm. An electrode (7) was formed on the layer (6). The electrode (7) had a shape of doughnut (ring-shape) in order not to obstruct emission of light. Although the electrode was made up of gold in this embodiment, other metals can be used for electrode. The electrode (7) is the upper electrode of the light emitting diode and the bottom electrode (8) was formed on the bottom surface of the silicon substrate by vacuum evaporation of gold. Characteristics of the light emitting diode (1) obtained by simulation were as follows. A voltage at the forward vias was 10 V when current was 20 mA, a light power was 60 μw when current was 20 mA, and a peak wavelength was 330 nm.

Figure 2:
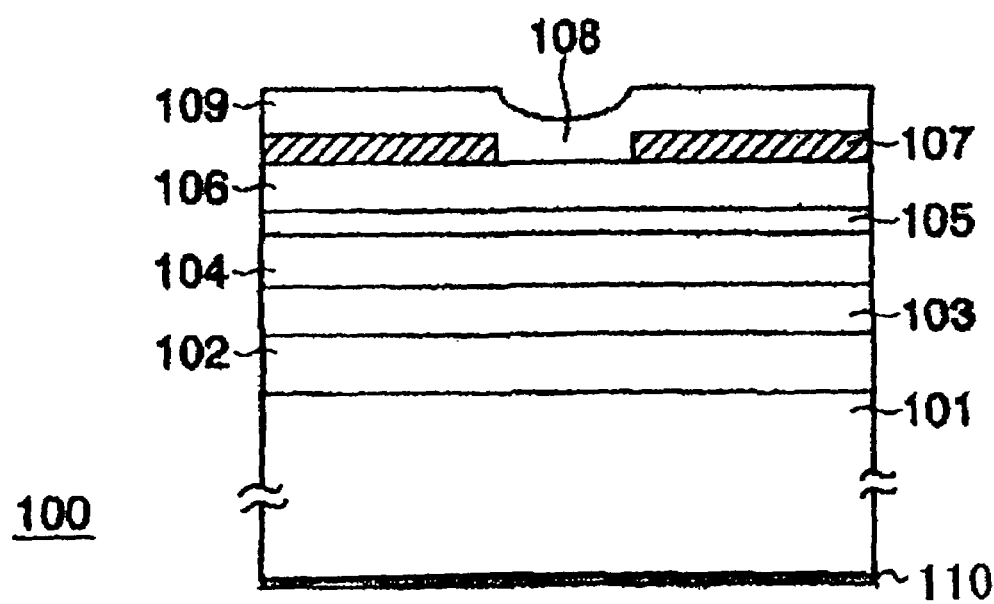
FIG. 2 is a schematic view of a laser diode according to the second embodiment of the present invention.

FIG. 2 shows a laser diode (100) according to the second embodiment of the present invention. Although a substrate (101) was silicon in this embodiment, other materials can be used.

The substrate (101) is desirable to be electrically conductive. A layer (102) consists of molybdenum oxide formed on the silicon substrate (101) by following steps. A molybdenum plate was prepared as source. A molybdenum plate and a silicon substrate were rinsed, dried and set in a growth chamber, at first. Then the growth chamber was heated so that a temperature of the source was 650° C. and that of the substrate was 550° C. under nitrogen atmosphere. After the source and the substrate were heated to their temperatures, respectively, high purity oxygen was introduced into the growth chamber and flow of oxygen was kept for 4 hours. A thickness of the layer (102) was 4.0 μm. The layer (102) was n type although it was not intentionally doped. As described for the first embodiment, it is considered that oxygen vacancies act as donors.

A buffer layer (103) was formed on the layer (102) in order to confine disorder in the layer (102). The disorder is introduced because the layer (102) has a different composition to the substrate (101). The layer (103) consists of molybdenum oxide formed by the method similar to that used to form the layer (3) in the first embodiment in which a temperature of the source was 700° C. and that of the substrate was 630° C. The layer (103) was n type with a carrier concentration of $3\times10^{17}$ cm$^{-3}$. A thickness of the layer (103) was 3.0 μm. A layer (104) of chromium molybdenum oxide ($Cr_{0.1}Mo_{0.9}O_3$) was formed on the layer (103). The layer (104) of chromium molybdenum oxide has a larger bandgap than molybdenum oxide and acts as a cladding layer which confines carrier and light in an active layer of the laser diode. Although the layer (104) was not intentionally doped, it was n type with a carrier concentration $6\times10^{16}$ cm$^{-3}$. It was formed by the method similar to that used to form the layer (3) in the first embodiment in which a temperature of the substrate (101) was 600° C. and that of the source, that is, a plate of molybdenum was 670° C. Chromium oxide was used as another source and its temperature was 670° C., too. A growth time was 3 hours and a thickness of the layer (104) was 3.0 μm. A layer (105) of a p type molybdenum oxide was formed on the layer (104) as an active layer of the laser diode (100). The layer (105) was doped with zinc and a hole concentration was $1\times10^{17}$ cm$^{-3}$. It was formed by the method similar to that used to form the layer (3) in the first embodiment in which a temperature of the substrate (101) on which the layers (102), (103) and (104) had been formed was 550° C. and that of the molybdenum source was 650° C. Zinc oxide was used as dopant source and was set between the source and the substrate where a temperature was 630° C. A thickness of the layer (105) was 0.5 μm. A layer (106) of chromium molybdenum oxide ($Cr_{0.1}Mo_{0.9}O_3$) was formed on the layer (105). The layer (106) has a larger bandgap than the active layer (105) of molybdenum oxide and acts as a cladding layer of the laser diode (100). The layer (106) was formed by the method similar to that used to form the layer (3) in the first embodiment in which a temperature of the molybdenum and chromium sources was 670° C. and that of the substrate (101) on which the layers (102), (103), (104) and (105) had been formed was 570° C. Zinc oxide was used as a dopant source and was set between the sources and the substrate where a temperature was 650° C. The layer (106) was p type with a hole concentration of $4.0\times10^{17}$ and had a thickness of 3.0 μm. A layer (107) of silicon dioxide was formed on the layer (106) except a central stripe region (108). Because silicon dioxide is resistive, current is limited to flow only in the stripe region (108). The silicon dioxide layer (107) was formed, for example, by sputtering and had a thickness of 100 nm. An electrode layer (109) was formed on the layer (107) and in the stripe region (108). Although the electrode layer (109) was formed by vacuum deposition of gold in an embodiment, other materials and other deposition methods can be used. The layer (109) is the upper electrode of the laser diode (100) while the substrate (101) acts as the bottom electrode because the substrate is conductive. A width and a length of the stripe region (108) were 20 and 500 μm, respectively, in this embodiment. FIG. 2 shows one edge surface of the laser diode (100) and another edge surface is parallel to the edge surface apart from it by a length of the stripe (108). A pair of the parallel surfaces form a Fabry-Perot resonator of the laser diode (100). Function of a Fabry-Perot resonator in a laser diode is well known in the art. The two edge surfaces are half mirror in order to form a Fabry-Perot resonator. In this embodiment, the edge surfaces were formed by cleavage because the substrate (101) was crystalline silicon. Cleavage is well known in the art. Other methods such as reactive ion etching can be used to form the edge surfaces.

Characteristics of the laser diode (100) were shown by simulation as follows. A threshold current density and a threshold voltage were 5.05 kA/cm$^2$ and 16.2 V, respectively at pulse oscillation of 5 μs/1 kHz. A peak wavelength was 330 nm.

FIG. 2 shows only essential elements of a laser diode and other elements can be added to improve characteristics of the laser diode. For example, a low resistive p type layer is formed on one cladding layer (106) in order to improve characteristics of an electrode.

Although in the embodiment shown in FIG. 2 the cladding layers (104) and (106) consist of chromium molybdenum oxide ($Cr_{0.1}Mo_{0.9}O_3$), chromium molybdenum oxide with other compositions ($Cr_xMo_{1-x}O_3$, X>0.1) or other materials can be used as far as they have larger bandgaps than that of molybdenum oxide.

Details of the present invention have been described with reference to the embodiments of a light emitting diode and a laser diode. Merits obtained from the fact that high-purity molybdenum oxide has a large bandgap are useful in other photonic devices based on the principle of the present invention. In addition, the fact that molybdenum oxide can be formed on substrates which consist of materials which are used in known semiconductor photonic devices makes them more useful in other photonic devices. Such applications of the present invention are easily derived in the art and they are included in the scope of the present invention.

For example, molybdenum oxide is used in devices such as photo-conductive devices, photo-diodes, photo-transistors, CCD and solar cells. Molybdenum oxide is used in photo-absorption regions of such devices. Especially, because molybdenum oxide formed on substrates which consist of materials which are used in known semiconductor devices is used in photonic devices various fabrication technologies of photonic devices can be used. Therefore possibilities of application of molybdenum oxide to photonic devices significantly enlarged according to the present invention.

What is claimed is:

1. A semiconductor photonic device which has a layer of crystalline molybdenum oxide formed directly by deposition on a substrate which consists of material selected from crystalline IV element semiconductors, crystalline III-V compound semiconductors, or crystalline IV compound semiconductors.

2. The semiconductor photonic device according to claim 1, wherein said photonic device is a photo-conductive device, a photo-diode, a photo-transistor, a light-emitting diode, a semiconductor laser, a solar cell or a CCD.

3. The semiconductor photonic device according to claim 1, wherein said photonic device is a light-emitting diode comprising a layer of molybdenum oxide formed by deposition directly on said substrate, a layer of n type molybdenum oxide and a layer of p type molybdenum oxide.

4. The semiconductor photonic device according to claim 3, wherein a buffer layer of molybdenum oxide formed by deposition directly on said substrate is interposed between said layer of molybdenum oxide on said substrate and said layer of n type molybdenum oxide.

5. The semiconductor photonic device according to claim 1, wherein said photonic device is a laser diode that comprises a first cladding layer of n type semiconductor on said molybdenum oxide layer formed by deposition directly on said substrate having a bandgap larger than that of said molybdenum oxide, an active layer of p type molybdenum oxide on said first cladding layer, and a second cladding layer of p type semiconductor on said active layer having a bandgap larger than that of said molybdenum oxide.

6. The semiconductor photonic device according to claim 5, wherein a buffer layer of molybdenum oxide formed by deposition directly on said substrate is interposed between said layer of molybdenum oxide on said substrate and said first cladding layer.

7. The semiconductor photonic device according to claim 3, wherein said substrate comprises silicon.

8. The semiconductor photonic device according to claim 5, wherein each of said first and second cladding layers comprises a layer of chromium molybdenum oxide.

9. A method of fabricating a semiconductor photonic device, which has a layer of crystalline molybdenum oxide formed directly on a substrate said method comprising the steps of:

preparing a source metal plate and a substrate which consists of material selected from crystalline IV element semiconductors, crystalline III-V compound semiconductors, or crystalline IV compound semiconductors;

rinsing said source and said substrate;

disposing said source and said substrate in a growth chamber;

heating said source to a temperature between 500° C. and 850° C. and said substrate to a temperature between 350° C. and 650° C. in an atmosphere of inert gas; and flowing oxygen into said growth chamber after heating said source and said substrate to the respective temperatures and keep the condition in said growth chamber for a predetermined period required to grow a layer of metal oxide with a desired thickness.

10. The semiconductor photonic device according to claim 4, wherein said substrate comprises silicon.

11. The semiconductor photonic device according to claim 5, wherein said substrate comprises silicon.

12. The semiconductor photonic device according to claim 6, wherein said substrate comprises silicon.

13. The semiconductor photonic device according to claim 6, wherein each of said first and second cladding layers comprises a layer of chromium molybdenum oxide.

14. The semiconductor photonic device according to claim 7, wherein each of said first and second cladding layers comprises a layer of chromium molybdenum oxide.

* * * * *